United States Patent
Tran et al.

(10) Patent No.: US 11,778,731 B2
(45) Date of Patent: Oct. 3, 2023

(54) SYSTEMS AND METHODS FOR BREAK OUT OF INTERCONNECTIONS FOR HIGH-DENSITY INTEGRATED CIRCUIT PACKAGES ON A MULTI-LAYER PRINTED CIRCUIT BOARD

(71) Applicant: Raytheon Company, Waltham, MA (US)

(72) Inventors: Thanh Tran, Dallas, TX (US); David G. Haedge, Dallas, TX (US); Alton Moore, McKinney, TX (US); Paul Ingerson, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 94 days.

(21) Appl. No.: 17/503,988

(22) Filed: Oct. 18, 2021

(65) Prior Publication Data

US 2023/0121836 A1 Apr. 20, 2023

(51) Int. Cl.
H05K 1/02 (2006.01)
H05K 1/11 (2006.01)
H05K 1/18 (2006.01)

(52) U.S. Cl.
CPC ......... *H05K 1/0228* (2013.01); *H05K 1/0245* (2013.01); *H05K 1/112* (2013.01); *H05K 1/114* (2013.01); *H05K 1/0251* (2013.01); *H05K 1/181* (2013.01); *H05K 2201/09227* (2013.01); *H05K 2201/09636* (2013.01); *H05K 2201/09672* (2013.01); *H05K 2201/09718* (2013.01)

(58) Field of Classification Search
CPC ...... H05K 1/0228; H05K 1/112; H05K 1/181; H05K 2201/09672; H05K 1/0245; H05K 1/116; H05K 1/0216; H05K 1/0233; H05K 1/16; H05K 1/165; H05K 1/114; H05K 1/0251; H05K 2201/09227; H05K 2201/09636; H05K 2201/09718; H05K 1/162
See application file for complete search history.

(56) References Cited

U.S. PATENT DOCUMENTS

| | | | |
|---|---|---|---|
| 7,405,477 B1* | 7/2008 | Tao | H05K 1/0243 257/730 |
| 9,198,280 B2* | 11/2015 | Biddle | H05K 1/0245 |
| 2002/0180004 A1* | 12/2002 | Oggioni | H01L 23/66 257/621 |

(Continued)

*Primary Examiner* — Steven T Sawyer
(74) *Attorney, Agent, or Firm* — Burns & Levinson, LLP; Joseph M. Maraia (57) ABSTRACT

A multi-layer printed circuit board having a first landing pad in a first layer and along a first axis arranged to receive a positive signal and a second landing pad in the first layer and along a second axis that is spaced away from the first axis longitudinally in the first layer and where the second landing pad arranged to receive a negative signal. A first buried in a second layer and along the first axis is spaced away from the first landing pad along the first axis. A second buried in the second layer and along the second axis is spaced away from the second landing pad along the second axis. A first signal connector provides a first electrical connection between the first landing pad and the second buried via and a second signal connector provides a second electrical connection between the second landing pad and the first buried via.

16 Claims, 9 Drawing Sheets

(56) References Cited

U.S. PATENT DOCUMENTS

| | | | | |
|---|---|---|---|---|
| 2006/0180905 A1* | 8/2006 | Zeng | ................ | H01L 23/49822 |
| | | | | 257/E23.079 |
| 2006/0227522 A1* | 10/2006 | Huang | ................ | H05K 1/0228 |
| | | | | 174/262 |
| 2012/0112868 A1* | 5/2012 | Wu | ....................... | H05K 1/165 |
| | | | | 29/829 |
| 2016/0181682 A1* | 6/2016 | Zhao | ................... | H05K 1/0245 |
| | | | | 333/5 |
| 2017/0338127 A1* | 11/2017 | Kumar | ................ | H01L 21/486 |
| 2022/0386452 A1* | 12/2022 | Asl | ..................... | H05K 1/0218 |

* cited by examiner

| DESCRIPTION | TYPE | PROCESSED THICKNESS | ISOLATION DISTANCE (SUMMED) | εr | COPPER LAYER TYPE | EXCESS RESIN |
|---|---|---|---|---|---|---|
| COPPER FOIL 106-75 | COPPER | 1.900 | | | SIGNAL | |
| T-12 UM COPPER FOIL 1080-70 | COPPER | 2.130 0.470 2.580 | 2.130 2.580 | 2.990 3.080 | PLANE | 16.510 25.400 |
| MULTIFUNC FR4 | MULTI FUNC FR-4 | 1.900 3.500 0.700 | 3.500 | 3.420 | SIGNAL | 0.000 |
| 106 PREPREG | MULTI FUNC FR-4 | 1.300 | 2.600 | 3.700 | PLANE | 0.000 |
| 106 PREPREG | MULTI FUNC FR-4 | 1.300 | - | 3.700 | PLANE | 0.000 |
| MULTIFUNC FR4 | MULTI FUNC FR-4 | 3.500 0.700 | 3.500 | 3.420 | SIGNAL | 0.000 |
| 106 PREPREG | MULTI FUNC FR-4 | 1.300 | 2.600 | 3.700 | PLANE | 0.000 |
| 106 PREPREG | MULTI FUNC FR-4 | 1.300 | - | 3.700 | PLANE | 0.000 |
| MULTIFUNC FR4 | MULTI FUNC FR-4 | 3.500 0.700 | 3.500 | 3.420 | SIGNAL | 0.000 |
| 106 PREPREG | MULTI FUNC FR-4 | 1.300 | 2.600 | 3.700 | PLANE | 0.000 |
| 106 PREPREG | MULTI FUNC FR-4 | 1.300 | - | 3.700 | PLANE | 0.000 |
| MULTIFUNC FR4 | MULTI FUNC FR-4 | 3.500 0.700 | 3.500 | 3.420 | SIGNAL | 0.000 |
| 106 PREPREG | MULTI FUNC FR-4 | 1.300 | 2.600 | 3.700 | PLANE | 0.000 |
| 106 PREPREG | MULTI FUNC FR-4 | 1.300 | - | 3.700 | PLANE | 0.000 |
| MULTIFUNC FR4 | MULTI FUNC FR-4 | 2.500 0.700 | 2.500 | 3.610 | PLANE | 0.000 |

SYSTEMS AND METHODS FOR BREAK OUT OF INTERCONNECTIONS FOR HIGH-DENSITY INTEGRATED CIRCUIT PACKAGES ON A MULTI-LAYER PRINTED CIRCUIT BOARD

TECHNICAL FIELD

This application relates generally to chip carriers and, more particularly, to break out configurations for interconnections of semiconductor device packages on a multi-layer printed circuit board.

BACKGROUND

An integrated circuit is a semiconductor device that has a substrate of a semiconductor material on which a series of layers are deposited using photolithographic techniques. An integrated circuit (IC) is typically housed in a chip carrier or chip package that includes interconnects or pins that connect the integrated circuit electronically to a printed circuit board (PCB). Chip packages may include a pin grid array (PGA), dual-in-line package (DIP), quad flat package (QFP), or ball grid array (BGA), among other types of packages. A BGA is a type of surface-mount package or chip carrier used for integrated circuits. BGA packages are typically used to mount devices such as microprocessors to a PCB. A BGA can provide more interconnection pins than are available on a typical dual in-line or quad flat package. The whole bottom surface of a BGA package can be used instead of just the perimeter. The traces connecting the package's leads to the wires or balls which connect the die of an IC to the chip package are also typically shorter than with a perimeter-only type chip package to enable improved performance at high speeds.

Figure 1A:
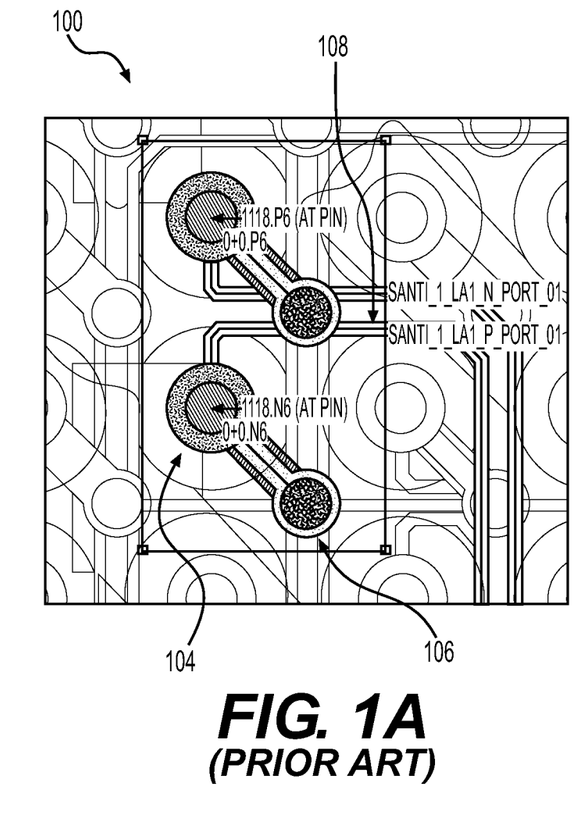
FIGS. 1A and 1B show a top-down and side view of a PCB including an IC respectively that uses the folded-in technique.
Figure 1B:
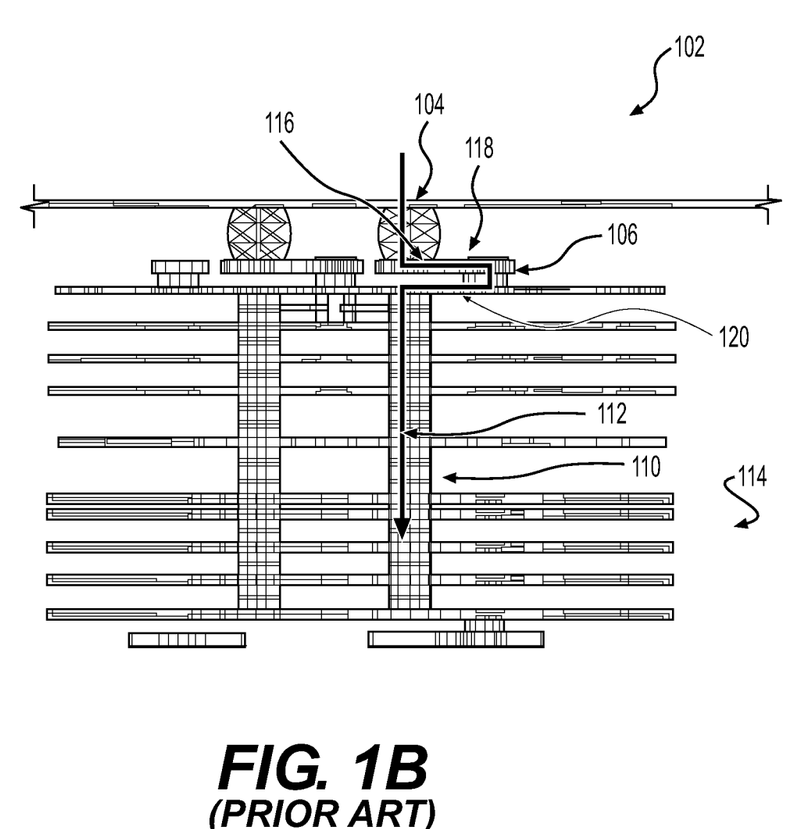

For a high-speed system PCB layout, escaping the signals out of a large high density chip package can significantly affect the performance of the system if the signals are not properly routed. One technical problem is that the common low pitch BGA package does not allow enough room for designers to configure the chip package interconnect pins in a way to properly escape the signals from the chip package to a PCB. So, to reduce the area required for break-out, the folded-in method or configuration illustrated in FIGS. 1A and 1B is commonly used. FIG. 1A shows a top-down view 100 of a PCB including an interconnect pad 104 and microvia 106 spaced away from pad 104 while trace 116 provides an electrical connection between pad 104 and microvia 106. Trace 108 is an example of a wire trace within one of the layers 114 of a multi-layer printed circuit board. The folded-in configuration is particularly susceptible to crosstalk caused by the rising and falling edge of a digital signal.

FIG. 1B shows a side view 102 of the PCB where signal or wire trace 118 extends from pad 104 to microvia 106 at a first layer and then extends back toward pad 104 along trace 120 at a lower layer to electrically connect with IC via 110. The traces 118 and 120 are separated by a gap 116. In such a configuration, signal 110 is folded back resulting in capacitive coupling of signal 110 onto itself between traces 118 and 120. The problem with this method is that the signal propagates from one layer to another and then folds back to the buried via 100 as via signal 110 propagation across gap 116 from trace 118 to trace 120. This causes self-interference (also referred to as "crosstalk") for high speed signaling.

SUMMARY

The application, in various implementations, addresses deficiencies associated with existing break out techniques from high-density chip packaging to PCB signal routing. The application includes exemplary devices, systems and fabrication methods for mitigating crosstalk associated with break out interconnect configurations and their adverse effects.

This application describes exemplary techniques and devices that reduce or eliminate interference or crosstalk effects caused by break out configurations of a PCB including techniques associated with differential pair signals or single ended signals. For differential pair signals, exemplary devices and techniques include a cross-coupled approach and/or method in which an interconnect and/or landing pad of the positive signal is routed to a buried via (e.g., located in a PCB layer below the layer where the landing pad is located) below the landing pad of the negative signal, and the interconnect and/or landing pad of the negative signal is routed to a buried via below the landing pad of the positive signal. Such a configuration enables a differential pair signal that is symmetrical to prevent self-coupling and resulting interference that can adversely affect device performance and/or signal output quality.

In one aspect, a PCB including an integrated circuit includes a first landing pad that is positioned in a first layer of the PCB and along a first axis extending to the integrated circuit. The first landing pad is arranged to receive a positive signal. The PCB also includes a second landing pad that is positioned in the first layer of the PCB and along a second axis extending to the integrated circuit, where the second axis is spaced away from the first axis longitudinally in the first layer. The second landing pad is arranged to receive a negative signal. The PCB includes a first buried via that is positioned in a second layer of the PCB and along the first axis extending to the integrated circuit. The first buried via is spaced away from the first landing pad along the first axis. The PCB also includes a second buried via that is positioned in the second layer of the PCB and along the second axis extending to the integrated circuit. The second buried via is spaced away from the second landing pad along the second axis. The PCB further includes a first signal connector arranged to provide a first electrical connection between the first landing pad and the second buried via. The PCB also includes a second signal connector arranged to provide a second electrical connection between the second landing pad and the first buried via.

In some implementations, the first signal connector includes a first microvia with a first trace connected to the first landing pad and a second trace connected to second buried via. In some implementations, the second signal connector includes a second microvia with a third trace connected to the second landing pad and a fourth trace connected to the first buried via. The PCB may include a third layer positioned between the first layer and the second layer. The third layer may form a gap along the first axis between the first landing pad and the first buried via. The third layer may form a gap along the second axis between the second landing pad and the second buried via. The first buried via may be in electrical communication with at least one additional via in an additional layer of the PCB. The second buried via may be in electrical communication with at least one additional via in an additional layer of the PCB.

In another aspect, a PCB including an integrated circuit includes a landing pad that is positioned in a first layer of the PCB and along a first axis extending to the integrated circuit. The landing pad may be arranged to receive a data signal. The PCB includes a buried via that is positioned in a second layer of the PCB and along the first axis extending to the integrated circuit. The buried via is spaced away from the landing pad along the first axis. The PCB also includes a signal connector arranged to provide an electrical connection between the landing pad and the buried via. The signal connector includes a microvia that is spaced longitudinally away from landing pad and the buried via. The microvia may be in electrical communication with a first trace connected to the landing pad and a second trace connected to the buried via where the first trace and second trace define a gap. The PCB further includes an isolator that is positioned within the gap between the first trace and the second trace. The isolator may include a conductive film. The conductive film may include a metal such as copper, aluminum, and the like.

In a further aspect, a method for manufacturing a PCB including an integrated circuit includes: positioning a first landing pad in a first layer of the PCB and along a first axis extending toward the integrated circuit, where the first landing pad is arranged to receive a positive signal; positioning a second landing pad in the first layer of the PCB and along a second axis extending toward the integrated circuit, where the second axis is spaced away from the first axis longitudinally in the first layer, and where the second landing pad is arranged to receive a negative signal; positioning a first buried via in a second layer of the PCB and along the first axis extending to the integrated circuit, where the first buried via is spaced away from the first landing pad along the first axis; positioning a second buried via in the second layer of the PCB and along the second axis extending to the integrated circuit, where the second buried via is spaced away from the second landing pad along the second axis; providing a first electrical connection using a first signal connector between the first landing pad and the second buried via; and providing a second electrical connection using a second signal connector between the second landing pad and the first buried via.

Any two or more of the features described in this specification, including in this summary section, may be combined to form implementations not specifically described in this specification.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

The application, in various implementations, addresses deficiencies associated with existing break out techniques for a printed circuit board. The application includes exemplary devices, systems and fabrication methods for mitigating crosstalk associated with break out interconnect configurations and their adverse effects.

This application describes exemplary techniques and devices that reduce or eliminate interference or crosstalk effects caused by break out configurations of a PCB including techniques associated with differential pair signals and single ended signals.

Figure 2:
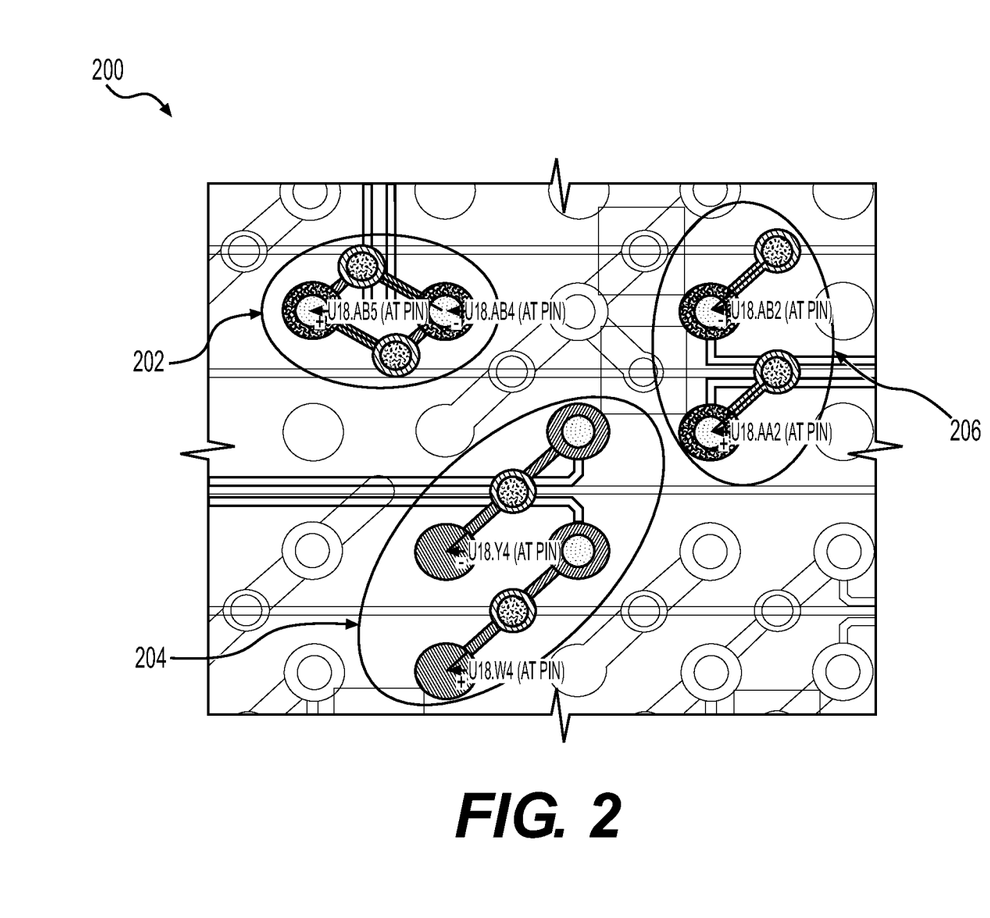
FIG. 2 shows a top-down view of various break out configurations including the cross-coupled configuration.

FIG. 2 shows a top-down view 200 of various break out configurations 202, 204, and 206 for a PCB having an IC including the cross-coupled configuration 202. As illustrated, cross-coupled configuration 202 has a small footprint and/or takes up a smaller surface area than the folded-out configuration 204 and folded-in configuration 206, which also susceptible to crosstalk associated with high frequency, fast switching signals.

Figure 3:
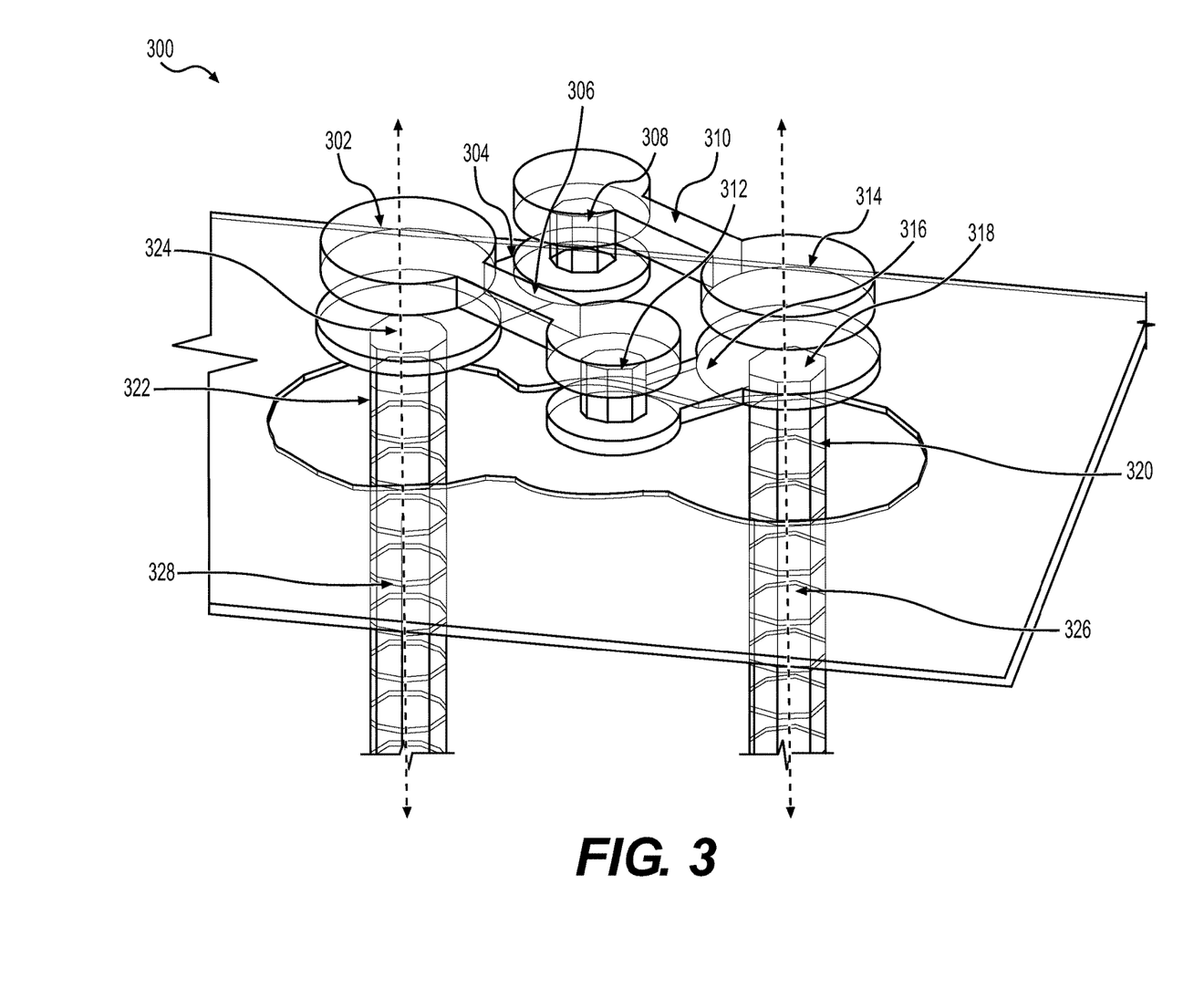
FIG. 3 shows a zoomed-in three-dimensional view of the cross-coupled configuration of FIG. 2.

FIG. 3 shows a zoomed-in three-dimensional view 300 of the cross-coupled configuration 202 of FIG. 2. Cross-coupled configuration 202 includes a first landing pad or interconnect 314 that is positioned in a first layer of the PCB and along a first axis 326 extending to the integrated circuit. The first landing pad 314 may be arranged to receive a positive signal. A second landing pad 302 is positioned in the first layer of the PCB and along a second axis 328 extending to the integrated circuit. The second axis 328 is spaced away from the first axis 326 longitudinally in the first layer. The second landing pad 302 may be arranged to receive a negative signal. A landing pad or other component may be centered about an axis 326 or 328, but need not be centered about an axis 326 or 328 to be positioned along an axis 326 or 328 as long as a portion of the component intersects the axis.

Configuration 202 may also include a first buried via 318 that is positioned in a second layer of the PCB and along the first axis 326 extending to the integrated circuit. The first buried via 318 may be spaced away from the first landing pad 314 along the first axis 326. A second buried via 324 may be positioned in the second layer of the PCB and along the second axis 328 extending to the integrated circuit. The second buried via 324 may be spaced away from the second landing pad 302 along the second axis 328. A first signal connector may be arranged to provide a first electrical connection between the first landing pad 314 and the second buried via 324. The first signal connector may include a first microvia 308 connected with a first trace 310 connected to the first landing pad 314 and connected with a second trace 304 connected to second buried via 324. A second signal connector may be arranged to provide a second electrical connection between the second landing pad 302 and the first buried via 318. The second signal connector may include a second microvia 312 connected with a third trace 306 connected to the second landing pad 302 and connected with a fourth trace 316 connected to the first buried via 318. The cross-coupled configuration 202 advantageous enables a differential signal including a positive signal introduced at pad 314 and a negative signal introduced at pad 302 that cancel out potential noise coupled to both signals and, thereby, inhibit or prevent crosstalk that is typically experienced in configuration 206.

Configuration 202 may include a third layer between the first layer and the second layer. The third layer may form a gap along the first axis 326 between the first landing pad 314 and the first buried via 318. The third layer may form a gap along the second axis 328 between the second landing pad 302 and the second buried via 324. The first buried via 318 may be in electrical communication with at least one additional via 320 in an additional layer of the PCB. The second buried via 324 may be in electrical communication with at least one additional via 322 in an additional layer of the PCB. The cross-coupled configuration 202 advantageously enables a differential pair signal to be symmetrical, while preventing adverse self-coupling that can degrade signal quality. The first axis 326 and the second axis 328 may be substantially parallel to each other.

Figure 4:
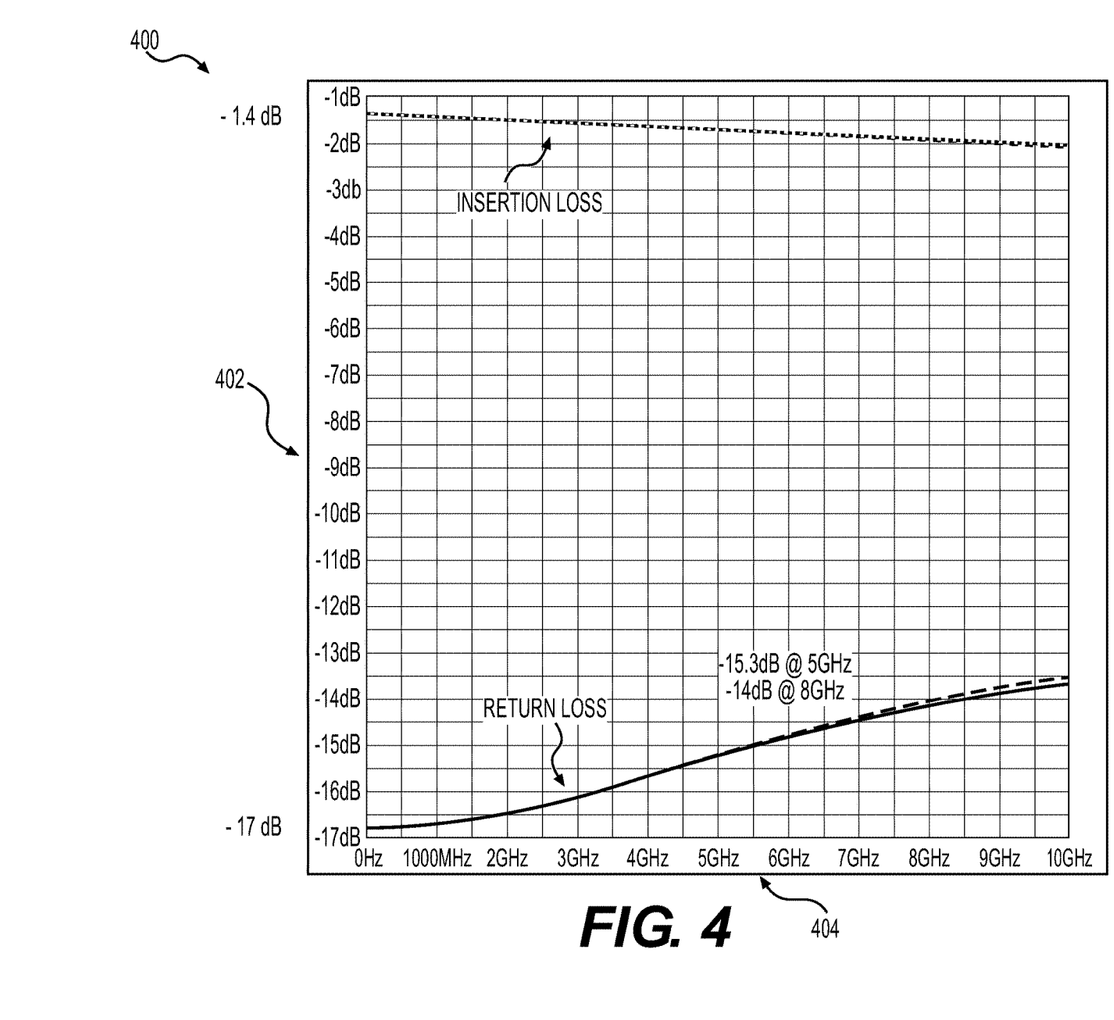
FIG. 4 includes a plot of return loss vs. frequency of a PCB using the cross-coupled technique.

FIG. 4 includes a plot 400 of return loss 402 vs. frequency 404 of a PCB using the cross-coupled technique. Plot 400 illustrates how the return loss increases as frequency increases, which is more significant in the folded-in configuration 206. At 5 GHz, the return loss for the cross-coupled configuration 202 is −15.3 dB, which is about 1.3 dB better than the folded in configuration 206. At 8 GHz, the return loss for the cross-coupled configuration 202 is −14 dB, which is about 3.1 dB better than the folded-in configuration 206.

Figure 5:
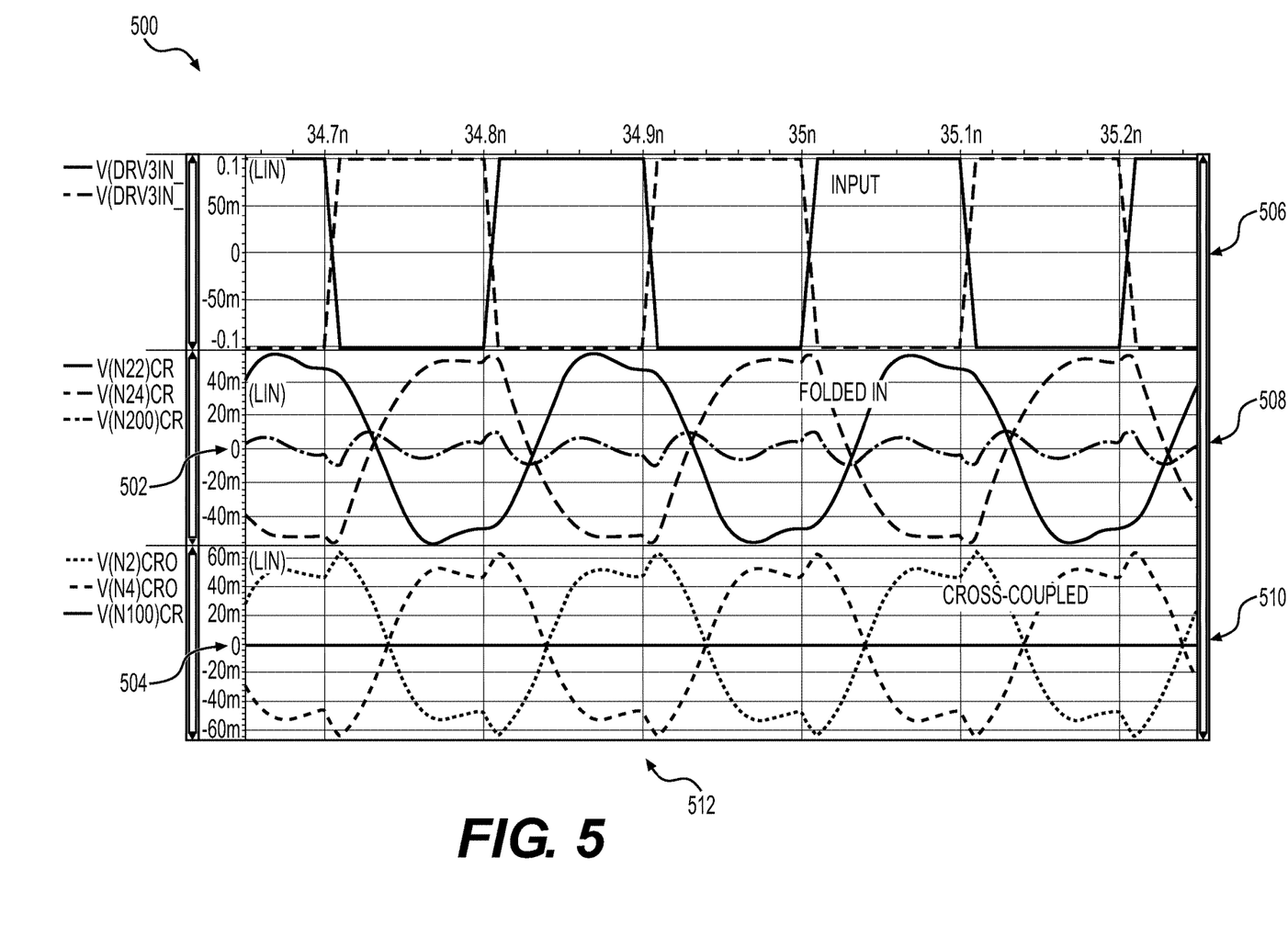
FIG. 5 includes various plots of amplitude vs. time for an input signal applied to a PCB using the folded-in technique and the cross-coupled technique.

FIG. 5 shows a combined plot 500 including various plots 506, 508, and 510 of amplitude vs. time 512 for an input signal applied to a PCB using the folded-in technique and the cross-coupled technique. Plot 506 shows a digital input signal (e.g., a square wave) that is input into a PCB having a folded-in configuration and a PCB have a cross-coupled configuration. Plot line 508 illustrates how the folded-in configuration results in a noisy signal 502 that is coupled to an IC on the PCB due to crosstalk interference. Plot line 504 illustrates how the cross-coupled configuration results in practically no noise signal due to the cross cancellation by the positive and negative opposing signals at both input landing pads.

Figure 6:
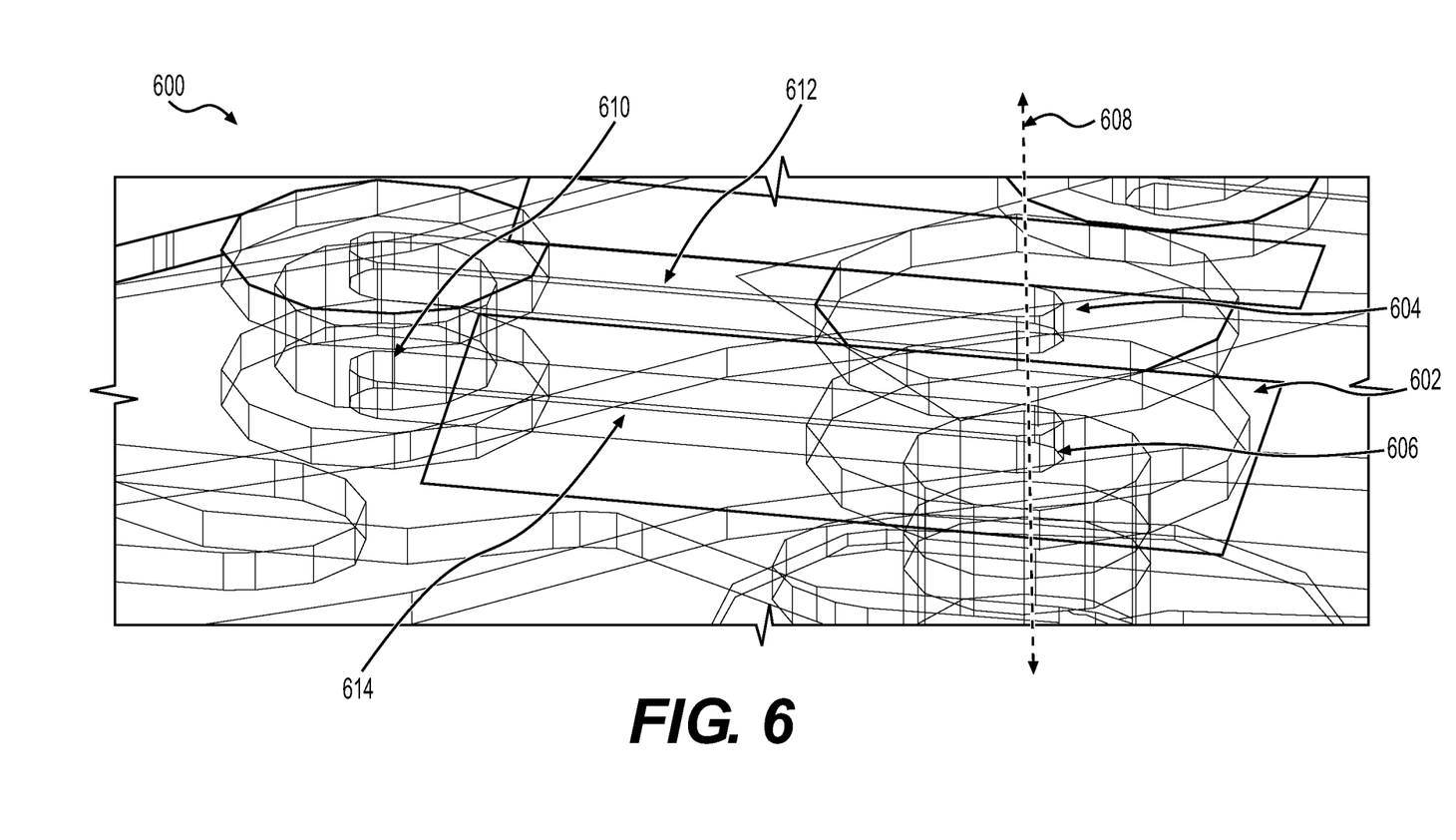
FIG. 6 shows a perspective three-dimensional view of a break out configuration for mitigating crosstalk for single ended signals.

FIG. 6 shows a perspective three-dimensional view of a break out configuration 600 of a PCB including an IC that mitigates crosstalk for single ended signals. Configuration 600 includes a landing pad 604 that is positioned in a first layer of the PCB and along a first axis 608 extending to the integrated circuit. The landing pad 604 is arranged to receive a singled ended data signal. Configuration 600 includes a buried via 606 that is positioned in a second layer of the PCB and along the first axis 608 extending to the integrated circuit. The buried via 606 is spaced away from the first landing pad 604 along the first axis 608. A signal connector is arranged to provide an electrical connection between the landing pad 604 and the buried via 606. The signal connector includes a microvia 610 spaced longitudinally away from landing pad 604 and the buried via 606. The microvia 610 may be in electrical communication with a first trace 612 connected to the landing pad 604 and a second trace 614 connected to the buried via 606. The first trace 612 and second trace 614 may define a gap therebetween. An isolator 602 may be positioned within the gap between the first trace 612 and the second trace 614. The isolator 602 may include a conductive film. The conductive film may include a metal such as, without limitation, copper, aluminum, gold, and the like. The isolator 602 electrically isolates the landing pad 604 and first trace 612 from the buried via 606 and second trace 614 to, thereby, prevent potential crosstalk and/or self-coupling between the components.

Figure 7:
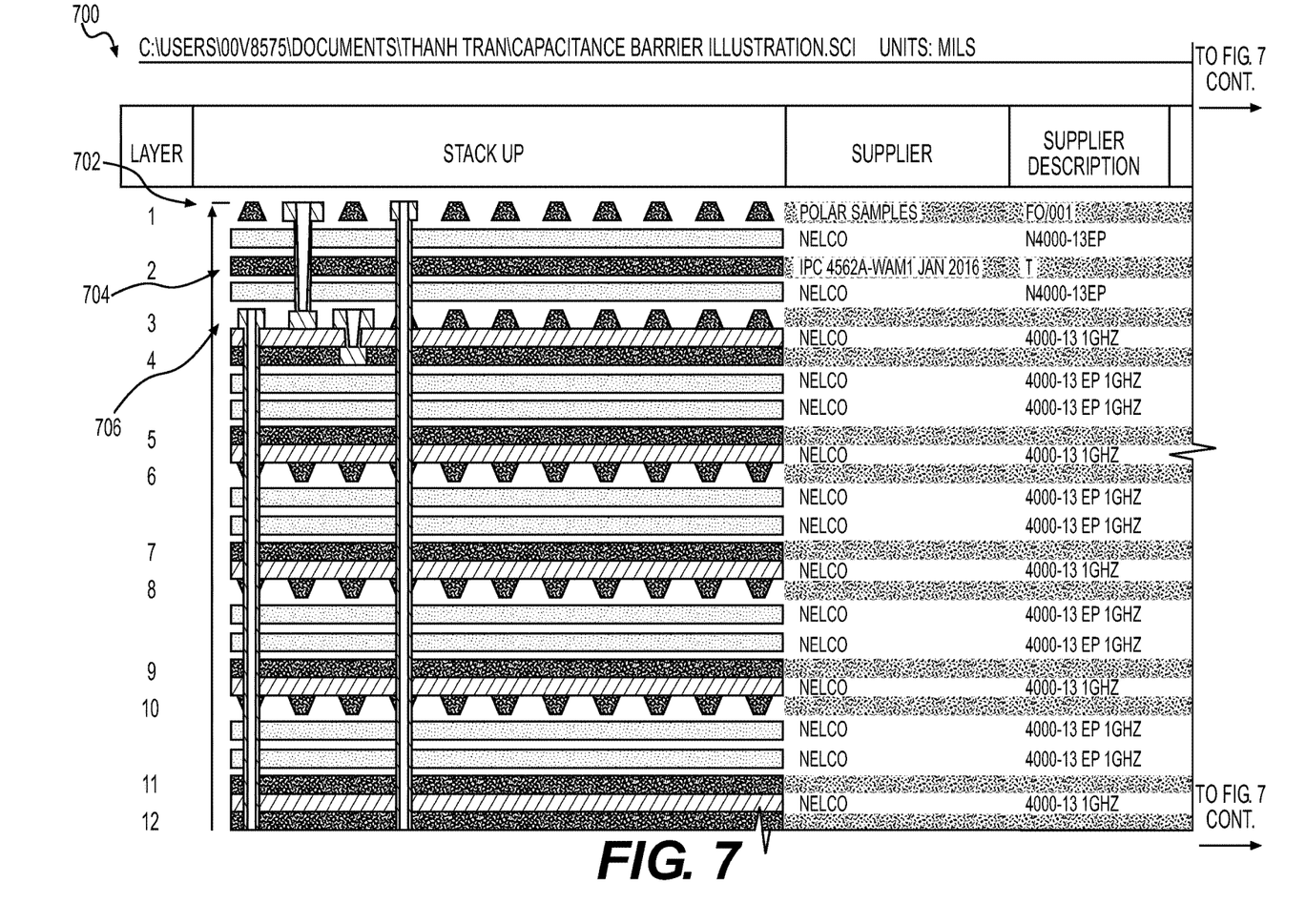
FIG. 7 shows a side view of the break out configuration of FIG. 6.

FIG. 7 shows a cross-section view 700 of the PCB configuration 600 of FIG. 6. FIG. 7 shows the first layer 702 where the landing pad 604 is positioned and the second layer 706 where the buried via 606 is positioned. The isolator 602 is position in layer 704 between the landing pad 604 and buried via 606 to prevent crosstalk and/or adverse self-coupling of a data signal between traces 612 and 614 and/or between pad 604 and buried via 606.

Figure 8:
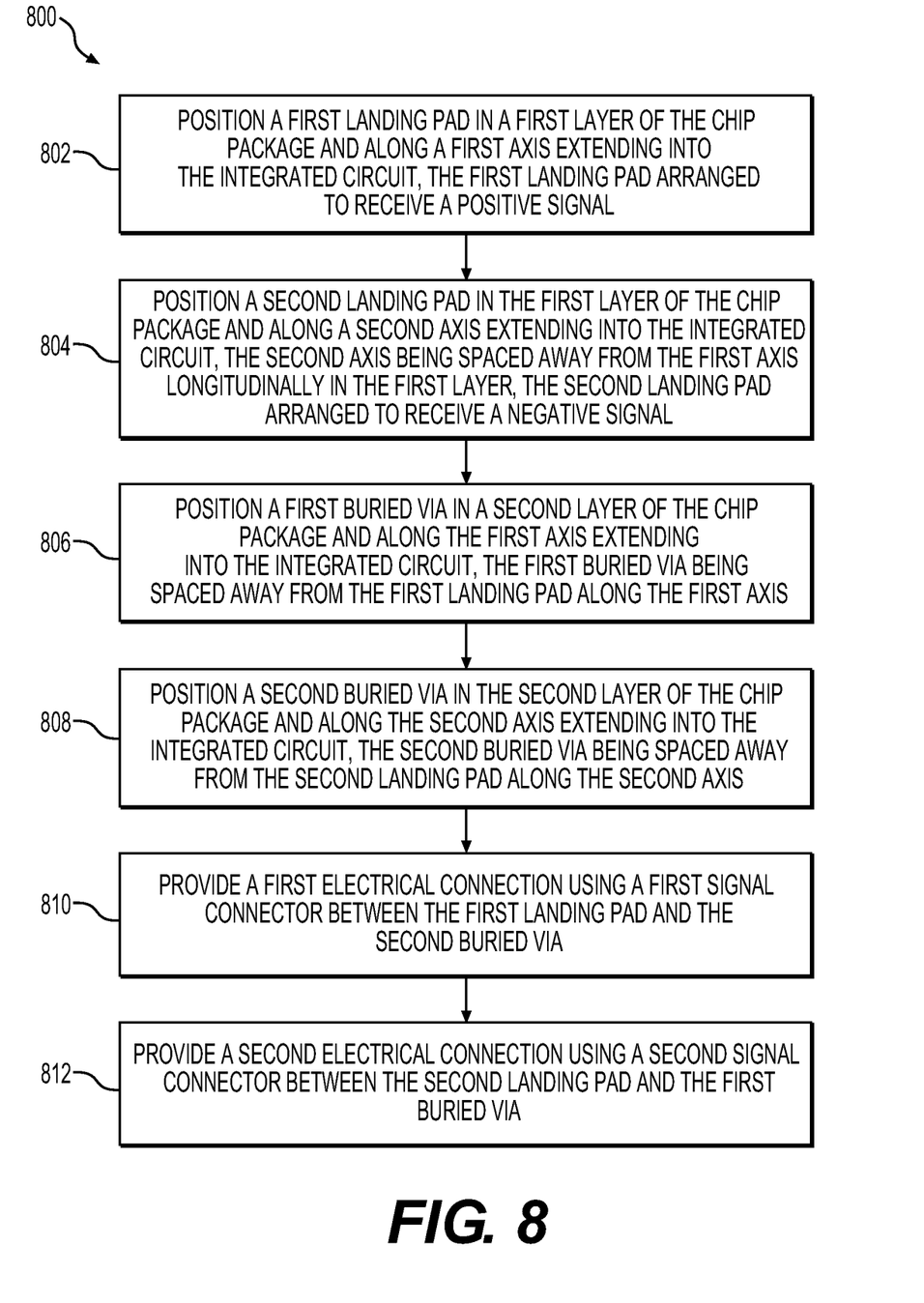
FIG. 8 is a process for fabrication a PCB for a semiconductor device including a break out configuration based on the cross-coupled approach.

FIG. 8 is a process 800 for fabrication a PCB for a semiconductor device including a break out configuration based on the cross-coupled approach. Process 800 includes: positioning a first landing pad 314 in a first layer of the PCB and along a first axis 326 extending to the integrated circuit, where the first landing pad 314 is arranged to receive a positive signal (Step 802); positioning a second landing pad 302 in the first layer of the PCB and along a second axis 328 extending to the integrated circuit, where the second axis 328 is spaced away from the first axis 326 longitudinally in the first layer, and where the second landing pad 302 is arranged to receive a negative signal (Step 804); positioning a first buried via 318 in a second layer of the PCB and along the first axis 326 extending to the integrated circuit, where the first buried via 318 is spaced away from the first landing pad 314 along the first axis 326 (Step 806); positioning a second buried via 324 in the second layer of the PCB and along the second axis 328 extending to the integrated circuit, where the second buried via 324 is spaced away from the second landing pad 302 along the second axis 328 (Step 808); providing a first electrical connection using a first signal connector between the first landing pad 314 and the second buried via 324 (Step 810); and providing a second electrical connection using a second signal connector between the second landing pad 302 and the first buried via 318 (Step 312).

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. A printed circuit board (PCB) including an integrated circuit comprising:
   a first landing pad being positioned in a first layer of the PCB and along a first axis extending to the integrated circuit, the first landing pad arranged to receive a positive signal;
   a second landing pad being positioned in the first layer of the PCB and along a second axis extending to the integrated circuit, the second axis being spaced away from the first axis longitudinally in the first layer, the second landing pad arranged to receive a negative signal;
   a first buried via being positioned in a second layer of the PCB and along the first axis extending to the integrated circuit, the first buried via being spaced away from the first landing pad along the first axis;
   a second buried via being positioned in the second layer of the PCB and along the second axis extending to the integrated circuit, the second buried via being spaced away from the second landing pad along the second axis;

a first signal connector arranged to provide a first electrical connection between the first landing pad and the second buried via; and a second signal connector arranged to provide a second electrical connection between the second landing pad and the first buried via.

2. The PCB of claim 1, wherein the first signal connector includes a first microvia with a first trace connected to the first landing pad and a second trace connected to second buried via.

3. The PCB of claim 1, wherein the second signal connector includes a second microvia with a third trace connected to the second landing pad and a fourth trace connected to the first buried via.

4. The PCB of claim 1 comprising a third layer between the first layer and the second layer.

5. The PCB of claim 4, wherein the third layer forms a gap along the first axis between the first landing pad and the first buried via.

6. The PCB of claim 4, wherein the third layer forms a gap along the second axis between the second landing pad and the second buried via.

7. The PCB of claim 1, wherein the first buried via is in electrical communication with at least one additional via in an additional layer of the PCB.

8. The PCB of claim 1, wherein the second buried via is in electrical communication with at least one additional via in an additional layer of the PCB.

9. A method for manufacturing a printed circuit board (PCB) including an integrated circuit comprising:

positioning a first landing pad in a first layer of the PCB and along a first axis extending toward the integrated circuit, the first landing pad arranged to receive a positive signal;

positioning a second landing pad in the first layer of the PCB and along a second axis extending to the integrated circuit, the second axis being spaced away from the first axis longitudinally in the first layer, the second landing pad arranged to receive a negative signal;

positioning a first buried via in a second layer of the PCB and along the first axis extending toward the integrated circuit, the first buried via being spaced away from the first landing pad along the first axis;

positioning a second buried via in the second layer of the PCB and along the second axis extending toward the integrated circuit, the second buried via being spaced away from the second landing pad along the second axis;

providing a first electrical connection using a first signal connector between the first landing pad and the second buried via; and providing a second electrical connection using a second signal connector between the second landing pad and the first buried via.

10. The method of claim 9, wherein the first signal connector includes a first microvia with a first trace connected to the first landing pad and a second trace connected to second buried via.

11. The method of claim 9, wherein the second signal connector includes a second microvia with a third trace connected to the second landing pad and a fourth trace connected to the first buried via.

12. The method of claim 9 comprising providing a third layer between the first layer and the second layer.

13. The method of claim 12, wherein the third layer forms a gap along the first axis between the first landing pad and the first buried via.

14. The method of claim 12, wherein the third layer forms a gap along the second axis between the second landing pad and the second buried via.

15. The method of claim 9, wherein the first buried via is in electrical communication with at least one additional via in an additional layer of the PCB.

16. The method of claim 9, wherein the second buried via is in electrical communication with at least one additional via in an additional layer of the PCB.

* * * * *